US009379132B2

(12) United States Patent
Koka et al.

(10) Patent No.: US 9,379,132 B2
(45) Date of Patent: Jun. 28, 2016

(54) NAND MEMORY STRINGS AND METHODS OF FABRICATION THEREOF

(71) Applicant: SanDisk Technologies, Inc., Plano, TX (US)

(72) Inventors: Sateesh Koka, Milpitas, CA (US); Raghuveer S. Makala, Campbell, CA (US); Yanli Zhang, San Jose, CA (US); Senaka Kanakamedala, Milpitas, CA (US); Rahul Sharangpani, Fremont, CA (US); Yao-Sheng Lee, Tampa, FL (US); George Matamis, Danville, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/523,287

(22) Filed: Oct. 24, 2014

(65) Prior Publication Data

US 2016/0118397 A1      Apr. 28, 2016

(51) Int. Cl.
| | | |
|---|---|---|
| *G11C 11/34* | (2006.01) | |
| *H01L 21/36* | (2006.01) | |
| *H01L 23/48* | (2006.01) | |
| *H01L 29/78* | (2006.01) | |
| *H01L 27/115* | (2006.01) | |
| *H01L 29/66* | (2006.01) | |

(52) U.S. Cl.
CPC .... *H01L 27/11582* (2013.01); *H01L 29/66666* (2013.01)

(58) Field of Classification Search
CPC ............ H01L 27/1157; H01L 29/7926; H01L 27/11582
USPC .......... 257/324, 329, E21.309; 438/257, 261, 438/264
See application file for complete search history.

(56) References Cited

U.S. PATENT DOCUMENTS

| | | |
|---|---|---|
| 5,915,167 A | 6/1999 | Leedy |
| 8,349,681 B2 | 1/2013 | Alsmeier et al. |
| 2010/0097859 A1 | 4/2010 | Shim et al. |
| 2011/0108897 A1* | 5/2011 | Koo .................. H01L 27/14609 257/292 |

(Continued)

OTHER PUBLICATIONS

Pdf document—'Damage—definition of damage by the Free Dictionary'.*

(Continued)

*Primary Examiner* — Kimberly Rizkallah
*Assistant Examiner* — Brian Turner
(74) *Attorney, Agent, or Firm* — The Marbury Law Group PLLC

(57) ABSTRACT

Methods of making monolithic three-dimensional memory devices include performing a first etch to form a memory opening and a second etch using a different etching process to remove a damaged portion of the semiconductor substrate from the bottom of the memory opening. A single crystal semiconductor material is formed over the substrate in the memory opening using an epitaxial growth process. Additional embodiments include improving the quality of the interface between the semiconductor channel material and the underlying semiconductor layers in the memory opening which may be damaged by the bottom opening etch, including forming single crystal semiconductor channel material by epitaxial growth from the bottom surface of the memory opening and/or oxidizing surfaces exposed to the bottom opening etch and removing the oxidized surfaces prior to forming the channel material. Monolithic three-dimensional memory devices formed by the embodiment methods are also disclosed.

25 Claims, 8 Drawing Sheets

(56) References Cited

U.S. PATENT DOCUMENTS

| | | | |
|---|---|---|---|
| 2011/0233648 A1* | 9/2011 | Seol | H01L 21/32137 257/324 |
| 2011/0298013 A1 | 12/2011 | Hwang et al. | |
| 2012/0018796 A1 | 1/2012 | Yahashi et al. | |
| 2012/0184107 A1* | 7/2012 | Sato | H01J 37/32192 438/703 |
| 2012/0280304 A1 | 11/2012 | Lee et al. | |
| 2013/0078776 A1* | 3/2013 | Kim | H01L 21/3105 438/268 |
| 2013/0334601 A1* | 12/2013 | Dong | H01L 29/66704 257/339 |
| 2014/0070302 A1* | 3/2014 | Yoo | H01L 27/1157 257/324 |
| 2015/0050803 A1* | 2/2015 | Lee | H01L 27/11582 438/588 |
| 2015/0214239 A1* | 7/2015 | Rhie | H01L 27/11556 257/321 |

OTHER PUBLICATIONS

Pdf document—'Heal Synonyms, Heal _Thesaurus.com'.*

Endoh et al., "Novel Ultra High Density Memory with Stacked-Sourrounding Gate Transistor (S-SGT) Structured Cell," IEDM Proc. (2001) 33-36.

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

International Searching Report and Written Opinion of the International Searching Authority for PCT/US2015/052191, dated Dec. 1, 2015, 12 pages.

* cited by examiner

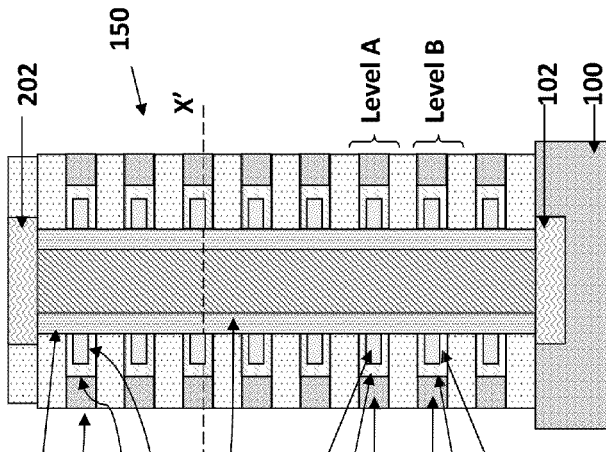
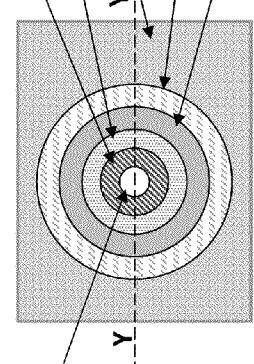
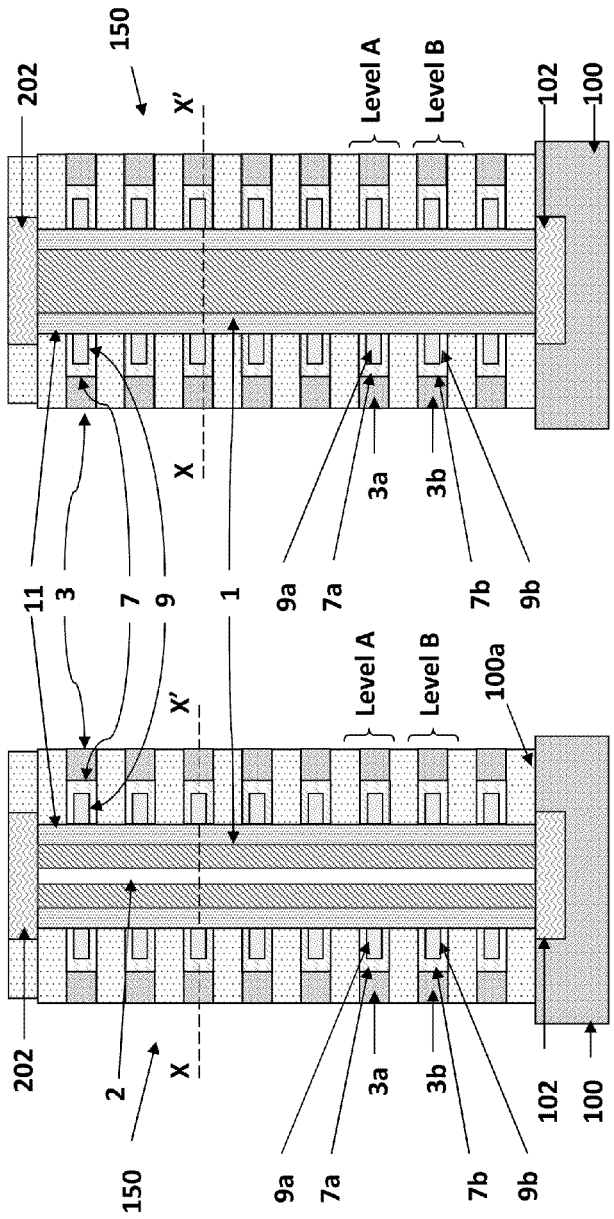
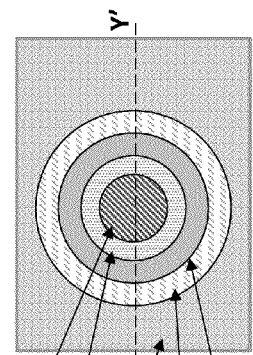

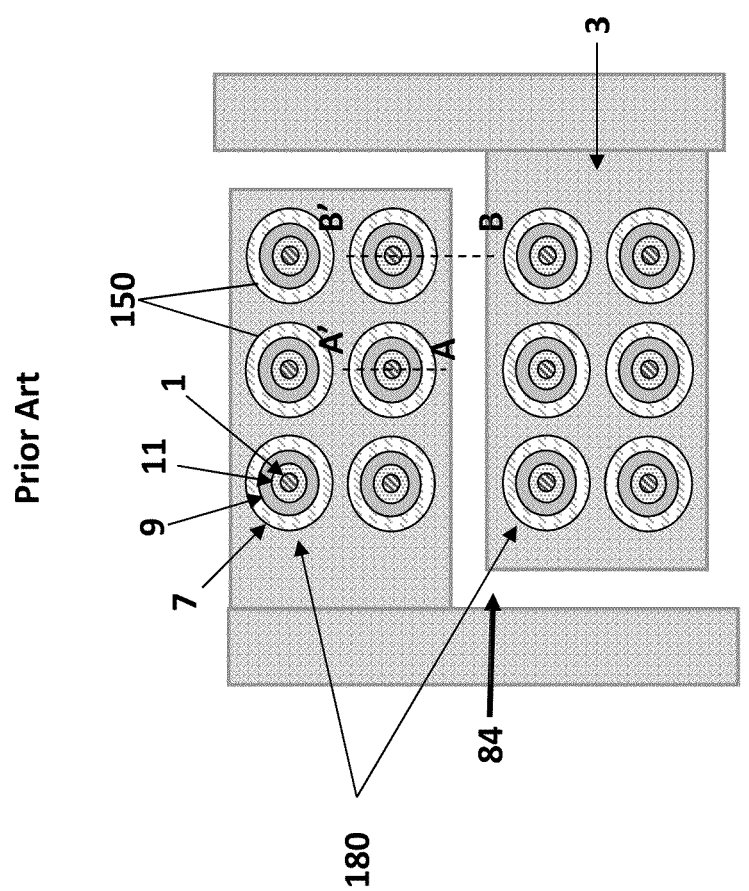

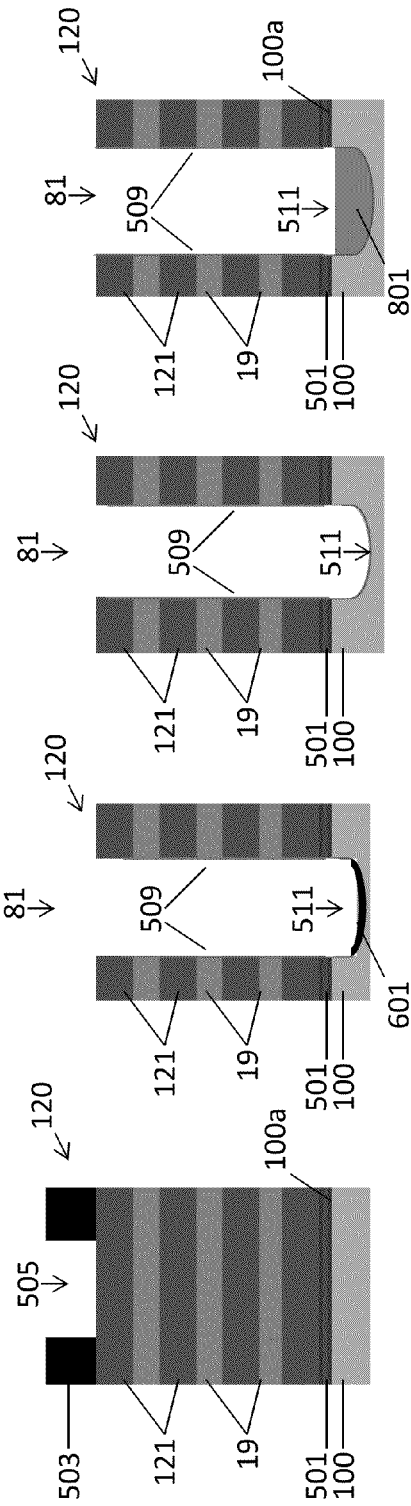
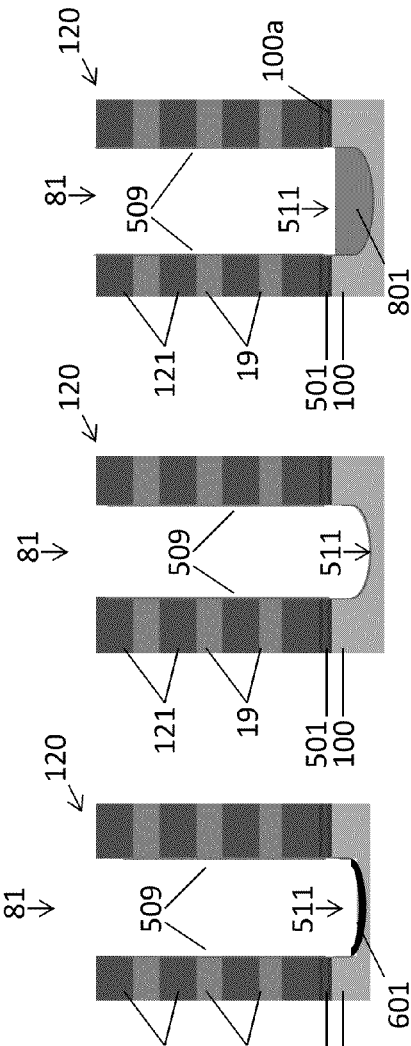
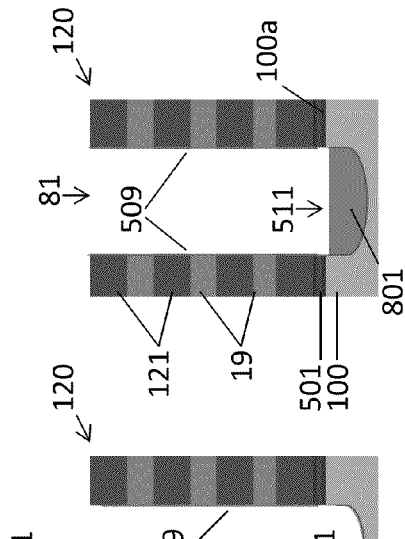
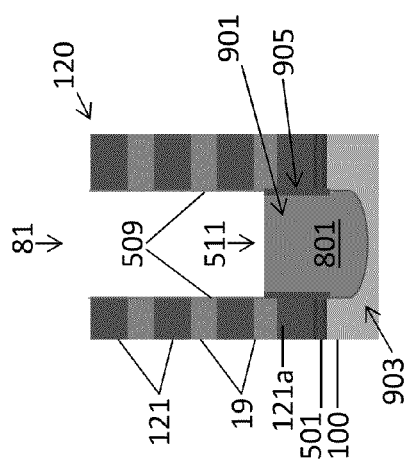

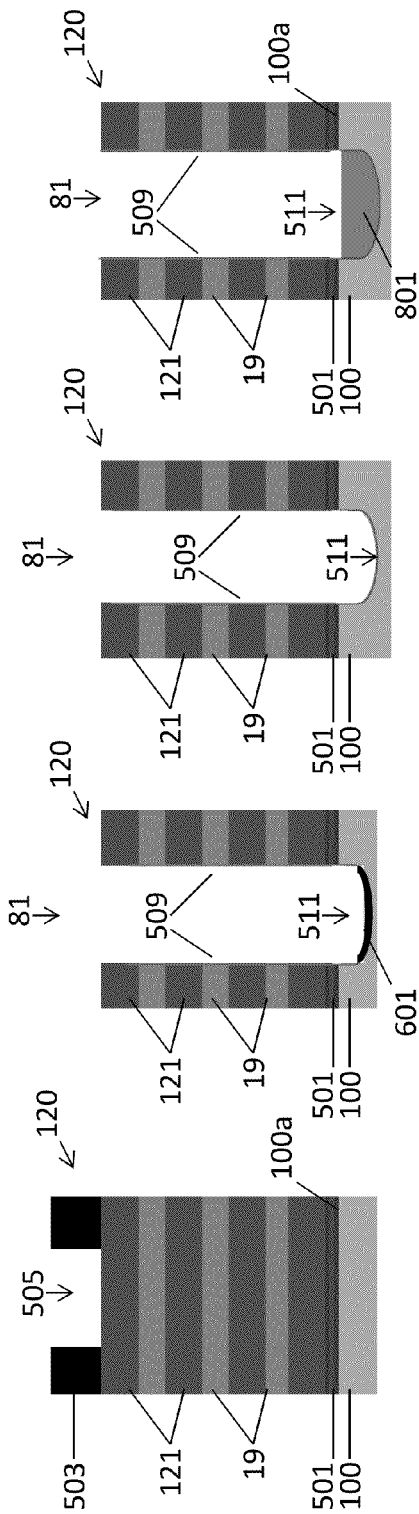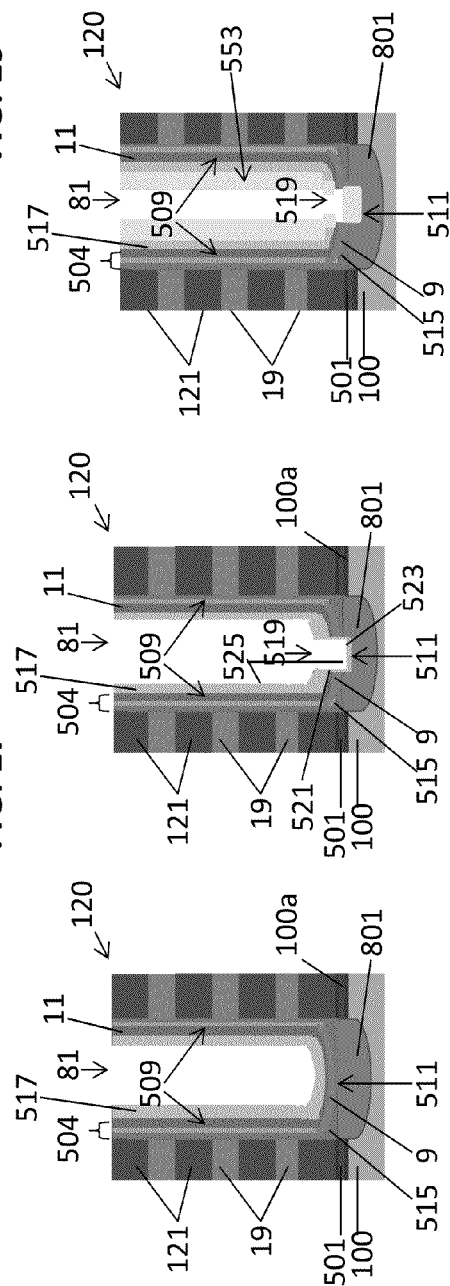

US 9,379,132 B2

NAND MEMORY STRINGS AND METHODS OF FABRICATION THEREOF

FIELD

The present disclosure relates generally to the field of semiconductor devices and specifically to monolithic three dimensional NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active region of the NAND string is formed by a relatively difficult and time consuming process involving repeated formation of sidewall spacers and etching of a portion of the substrate, which results in a roughly conical active region shape.

SUMMARY

An embodiment relates to a method of fabricating a memory device that includes forming a material layer stack over a major surface of a semiconductor substrate, etching the stack through a mask to the semiconductor substrate using a first etching process to form a memory opening having a sidewall defined at least in part by the stack and a bottom surface that is defined by the semiconductor substrate, etching through the memory opening using a second etching process that is different from the first etching process to remove a damaged portion of the semiconductor substrate from the bottom surface of the memory opening, forming a single crystal semiconductor material over the semiconductor substrate on the bottom surface of the memory opening using an epitaxial growth process, forming at least one memory film on at least a portion of the sidewall of the memory opening and over the single crystal semiconductor material on the bottom surface of the memory opening, forming a layer of semiconductor material over the at least one memory film on at least a portion of the sidewall of the memory opening and on the bottom surface of the memory opening, etching through the memory opening using a third etching process to remove a portion of the layer of semiconductor material and a portion of the at least one memory film from over the bottom surface of the memory opening and expose the single crystal semiconductor material on the bottom surface of the memory opening, and forming a semiconductor channel material over the layer of semiconductor material on the sidewall of the memory opening and over the single crystal semiconductor material on the bottom surface of the memory opening.

Another embodiment relates to a monolithic three dimensional NAND memory device that includes a plurality of control gate electrodes extending substantially parallel to a major surface of a semiconductor substrate, where the plurality of control gate electrodes include at least a first control gate electrode located in a first device level and a second control gate electrode located in a second device level located over the major surface of the substrate and below the first device level, and an interlevel insulating layer located between the first control gate electrode and the second control gate electrode. The monolithic three dimensional NAND memory device also includes a semiconductor channel material extending substantially perpendicular to the major surface of the substrate through the plurality of device levels and contacting a single crystal semiconductor material located in or on the substrate, where the semiconductor channel material includes a generally cylindrically-shaped first portion which contacts the single crystal semiconductor material at the bottom surface of the memory opening and extends from the bottom surface of the memory opening in a first direction that is substantially perpendicular to the major surface of the substrate, a generally disk-shaped second portion which includes a projection extending from a sidewall of the first portion into a first recess substantially parallel to the major surface of the substrate; a generally disk-shaped third portion which includes a projection extending from a sidewall of the first portion into a second recess substantially parallel to the major surface of the substrate, a fourth portion that extends radially-outwards from the first portion above the layer of semiconductor material substantially parallel to the major surface of the substrate, and a hollow, generally cylindrically-shaped fifth portion that extends from the above the fourth portion over the sidewall of the memory opening. The monolithic three dimensional NAND memory device also includes at least one memory film located between each of the plurality of control gate electrodes and the semiconductor channel material.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIG. 4 is a top schematic view of a portion of a memory device comprising NAND strings.

FIGS. 5-15 illustrate schematic side cross sectional view of steps in a method of making a NAND string including dual epitaxial growth steps to heal damaged surfaces of semiconductor materials according to one embodiment.

FIGS. 16-25 illustrate schematic side cross sectional view of steps in a method of making a NAND string including oxidation of damaged surfaces of semiconductor materials followed by an epitaxial growth step according to another embodiment.

DETAILED DESCRIPTION

Figure 3:
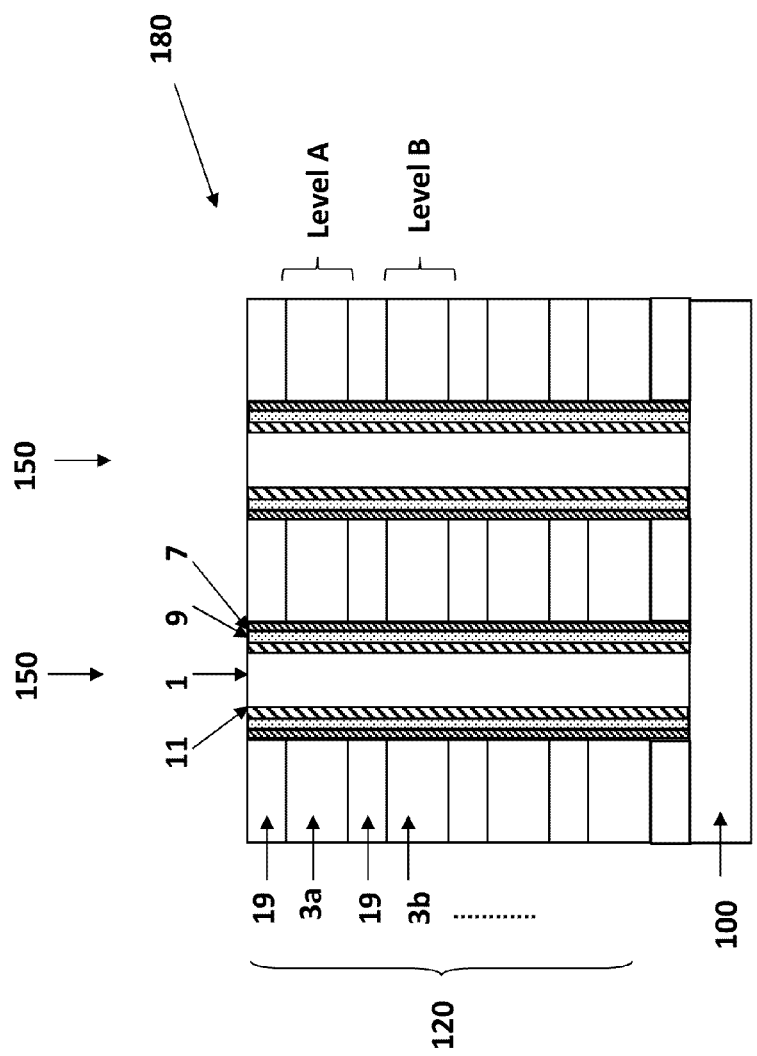
FIG. 3 is a side cross sectional view of a conventional NAND string device.

Various embodiments relate to monolithic three-dimensional NAND memory strings and methods of fabricating monolithic three-dimensional NAND memory strings. In some embodiments, a material layer stack over a semiconductor substrate may be etched to the substrate using a first etching process to form a memory opening, the memory opening may be etched using a second etching process different from the first etching process to remove a damaged portion of the semiconductor substrate from the bottom surface of the memory opening, and a single crystal semiconductor material may be formed over the semiconductor substrate on the bottom surface of the memory opening using an epitaxial growth process. At least one memory film and a layer of semiconductor material may be formed in the memory opening over the single crystal semiconductor material, and a third etching process may be used to remove a portion of the layer of semiconductor material and the at least one memory film from the bottom of the memory opening to expose the single crystal semiconductor material. A semiconductor channel material may be formed in the memory opening and over the single crystal semiconductor material on the bottom surface of the memory opening.

In one embodiment, the layer of semiconductor material may comprise polycrystalline or amorphous semiconductor material, and the semiconductor channel material may be formed by forming a single crystal semiconductor layer of channel material over the layer of polycrystalline or amorphous semiconductor material by epitaxial growth from the single crystal semiconductor material exposed on the bottom surface of the memory opening. In some embodiments, the single crystal semiconductor layer of channel material may be formed over portions of the layer of polycrystalline or amorphous semiconductor material and the single crystal semiconductor material exposed on the bottom surface of the memory opening that are damaged by the third etching process to at least partially heal the damage.

In another embodiment, an oxide layer may be formed in the memory opening by surface oxidation of the layer of semiconductor material and the single crystal semiconductor material exposed on the bottom surface of the memory opening by the third etching process and the oxide layer may be removed prior to forming the semiconductor channel material. In some embodiments, the oxide layer may be formed by oxidizing surfaces of the layer of semiconductor material and the single crystal semiconductor material that are damaged by the third etching process, and the oxide layer may be removed by a fourth etching process that is different from the first etching process and selectively etches the oxide material without removing the layer of semiconductor material and the single crystal semiconductor material on the bottom surface of the memory opening.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, the monolithic three dimensional NAND string 150 comprises a semiconductor channel 1 having at least one end portion extending substantially perpendicular to a major surface 100a of a substrate 100, as shown in FIGS. 1A, 2A and 3. "Substantially perpendicular to" (or "substantially parallel to") means within 0-10°. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A, 2A and 3. The channels 1 may be electrically connected to first and second (e.g., source and drain) electrodes 102, 202 which are schematically shown in FIGS. 1A and 2A. The first (e.g., source) electrode 102 may connect to the bottom of the channel 1 and the second (e.g., drain electrode 202) may connect to the top of the channel 1. The NAND string 150 may further include drain-side and source-side select or access transistors (not shown in FIGS. 1A, 2A and 3 for clarity) which may be located above and below the memory levels of the NAND string 150, respectively.

In some embodiments, the semiconductor channel 1 may be a filled feature, as shown in FIGS. 2A, 2B and 3. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The channel 1 shown in FIG. 3 may alternatively be a hollow cylinder filled with an insulating fill material 2, shown in FIGS. 1A-1B.

A memory array 180 may comprise a plurality of NAND strings 150 formed in a stack 120 of material layers over the substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B and 3 and electrically separated from each other by a plurality of electrically insulating layers 19 forming a stack 120 of alternating control gate electrodes 3 and insulating layers 19. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof or combination of these materials. For example, the control gate material in FIGS. 1A and 2A may comprise a conductive metal or metal alloy, such as tungsten and/or titanium nitride, while the control gate material in FIG. 3 may comprise doped polysilicon.

A blocking dielectric 7 is located adjacent to the control gate(s) 3 and may surround the control gate 3, as shown in FIGS. 1A and 2A. Alternatively, a straight blocking dielectric layer 7 may be located only adjacent to an edge (i.e., minor surface) of each control gate 3, as shown in FIG. 3. The blocking dielectric 7 may comprise one or more layers having a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 1A and 2A. Alternatively, the blocking dielectric 7 may be a straight, continuous layer, as shown in FIG. 3, similar to the device described in U.S. Pat. No. 8,349,681 issued on Jan. 8, 2013 and incorporated herein by reference in its entirety.

The monolithic three dimensional NAND string also comprises a charge storage region 9. The charge storage region 9 may comprise one or more continuous layers which extend the entire length of the memory cell portion of the NAND string, as shown in FIG. 3. For example, the charge storage region 9 may comprise an insulating charge trapping material, such as a silicon nitride layer.

Alternatively, the charge storage region may comprise a plurality of discrete charge storage regions or segments 9 located between the blocking dielectric and the channel 1, as shown in FIGS. 1A and 2A. The plurality of discrete charge storage regions 9 comprise at least a first discrete charge storage region 9a located in the device level A and a second discrete charge storage region 9b located in the device level B, as shown in FIGS. 1A and 2A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal particles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

FIG. 4 is a top schematic view illustrating a portion of a memory device comprising one or more arrays 180 of NAND strings 150 having channels 1 located in respective memory openings 81 (e.g., front side openings). In this device, the memory openings 81 are circular, thereby resulting in cylindrical pillar shaped NAND strings 150. From the top view, the tunnel dielectric 11, charge storage region 9 and blocking dielectric 7 form concentric rings around the channel 1. The control gate 3 in each device level is generally slab shaped. A back side opening 84, such as a trench, electrically separates adjacent control gates 3 and arrays 180 (e.g., memory blocks) of NAND strings 150 from each other. As discussed in more detail below, the back side opening 84 may be used in the manufacture of NAND strings 150 according to some embodiments. The array 180 may be located on a substrate (e.g., a silicon substrate), such the substrate 100 shown in FIGS. 1A, 2A and 3, and the substrate may contain an integrated circuit comprising a driver circuit for the array 180 of NAND strings 150.

Various embodiments relate to methods of making a monolithic three-dimensional NAND string 150. The NAND strings 150 may be similar to the NAND strings 150 shown in FIGS. 1A-4, and may include a semiconductor channel 1 extending substantially perpendicular to the major surface 100a of a substrate 100, and a plurality of control gates 3, each extending substantially perpendicular to the major surface 100a of the substrate 100 in a respective device level (e.g., Level A, Level B, etc.). A blocking dielectric 7, a charge storage region 9 and a tunnel dielectric 11 may be located between the control gates 3 and the semiconductor channel 1 in each of the device levels. In embodiments, the blocking dielectric 7 may be located between the control gate 3 and the charge storage region 9, the charge storage region 9 may be located between the blocking dielectric 7 and the tunnel dielectric 11, and the tunnel dielectric 11 may be located between the charge storage region 9 and the semiconductor channel 1.

A typical method for forming a NAND string memory device, such as the devices shown in FIGS. 1A-4, includes forming a stack of alternating layers of insulating material and sacrificial material over a major surface of a substrate and etching the stack through a mask to form memory openings (i.e., front side openings) through the stack in the future locations of the NAND strings. The stack may be etched to the substrate using a directional etching process, such as a reactive ion etch (RIE) process. The mask may be removed and the memory openings cleaned and optionally portions of the substrate that are removed from the bottom surfaces of the memory openings during the etching step may be regrown using an epitaxial growth process.

The NAND strings may be formed in the memory openings using both "front side" and "back side" processing steps with respect to the memory openings. The "front side" processing may include forming at least one memory film (e.g., a blocking dielectric 7, charge storage region 9 and/or tunnel dielectric 11, as described above with reference to FIGS. 1A, 2A and 3) over the sidewalls and bottom surfaces of the memory openings, forming a sacrificial layer of semiconductor material (e.g., polysilicon or amorphous silicon) over the at least one memory film, and performing an additional etching step (i.e., a bottom opening etch) to remove the sacrificial layer and the at least one memory film from over the bottom surfaces of the memory openings and expose the semiconductor material (typically single crystal silicon) at the bottom of the memory openings. Then, a semiconductor channel material (e.g., polysilicon) is formed over the sacrificial layer of semiconductor material and the at least one memory film on the sidewalls of the memory openings and contacting the exposed semiconductor material at the bottom surface of the memory openings.

The "back side" processing typically includes forming a back side opening (e.g., trench 84, such as shown in FIG. 4) adjacent to the array of memory openings, etching through the trench to remove the layers of sacrificial material and provide back side recesses between the layers of insulating material of the stack, and forming control gate electrodes (e.g., control gates 3 as shown in FIGS. 1A, 2A and 3) within the back side recesses. In some embodiments, at least a portion of the memory film (e.g., blocking dielectric 7) may be formed within the back side recesses, and the control gate electrodes may be formed over the memory film. A dielectric material may be formed within the back side opening to electrically insulate the back side opening from the control gates, and a conductive source line (e.g., a source side electrode 102, described above with reference to FIGS. 1A and 2A) may be formed within the back side opening.

The present inventors realized that the conventional method for making NAND string memory devices may result in damage to the device which may negatively impact device performance. For example, the first etching step used to form the memory openings in the stack may damage the surface of the semiconductor substrate. In addition, even after cleaning the memory openings, etching by-products may still be present on the exposed surfaces of the substrate at the bottoms of the memory openings. Thus, when the etched portions of the substrate are re-grown using an epitaxial growth process, voids may form in the material, resulting in poor quality epitaxial material at the bottom of the memory openings.

Also, the bottom opening etch that is performed to remove the sacrificial layer of semiconductor material and the at least one memory film from over the bottom surface of the memory opening may damage both the semiconductor material that is exposed at the bottom surface of the memory opening as well as the exposed surface of the sacrificial layer of semiconductor material that extends over the sidewall of the memory opening. In the conventional method, the semiconductor channel material is deposited over these damaged surfaces without healing the etch damage. The damaged interfaces between the channel material and the semiconductor material at the bottom of the memory opening and between the channel material and the sacrificial semiconductor material over the sidewall of the memory opening may result in degraded performance of the NAND string, including lower string current, higher sub threshold voltage slope, and larger leakage current.

Various embodiments include methods of making monolithic three-dimensional memory devices, such as NAND string devices, and devices made in accordance with the embodiment methods, which may have improved performance due to removal of the etching damage. Embodiments may include performing a second etching step using a different etching process from the process used to form the memory openings in order to remove a damaged portion of the semiconductor substrate from the bottom surfaces of the memory openings. Following the second etching step, a single crystal semiconductor material may be formed over the substrate on the bottom surfaces of the memory openings using an epitaxial growth process. Because the damaged portions of the substrate are removed by the second etching process, the epitaxial single crystal semiconductor material may be a relatively high-quality material.

Additional embodiments may include improving the quality of the interface between the semiconductor channel material and the underlying semiconductor layers in the memory opening which may be damaged by the bottom opening etch. In one embodiment, at least a portion of the semiconductor channel material may comprise single crystal semiconductor material that is formed by epitaxial growth from the single crystal semiconductor material on the bottom surface of the memory opening exposed by the bottom opening etch. The epitaxial single crystal semiconductor material may be formed over the surfaces damaged during the bottom opening etch to at least partially heal the damage caused by the bottom opening etch.

In other embodiments, following the bottom opening etch, the surfaces that are damaged by the bottom opening etch may be oxidized. The oxidation may consume the damaged semiconductor surfaces, leaving a high-quality interface. After removing the oxide, the semiconductor channel material may be formed.

A first embodiment method of making a NAND string 150 is illustrated in FIGS. 5-15. FIGS. 5-12 are side cross-sectional views illustrating the formation of a portion of a NAND string array 180 (e.g., such as shown in FIG. 3) and taken along line A-A' in the top schematic view of FIG. 4. As illustrated in FIG. 5, the method includes forming a stack 120 of alternating first material layers 19 and second material layers 121 over a major surface 100a of a semiconductor substrate 100, which may be a silicon substrate. The second material is different from the first material. The layers 19, 121 may be formed by a suitable deposition method, such as sputtering, CVD, PECVD, LPCVD, ALD, etc. The layers 19, 121 may be 6 to 100 nm thick.

In one embodiment, the first material layers 19 comprise an electrically insulating material, such as an oxide (e.g., silicon oxide, silicon oxynitride, a high-k dielectric, etc.). The second material layers 121 may comprise a sacrificial material, such as an insulating material that is different from the material of the first layers 19. For example, layers 19 may comprise silicon oxide (e.g., formed using a tetraethyl orthosilicate (TEOS) source) and layers 121 may comprise silicon nitride forming an ONON stack 120. Alternatively, layers 19 may comprise silicon oxide and layers 121 may comprise polysilicon forming an OPOP stack 120. As shown in FIG. 5, a cover layer 501 of insulating material (e.g., silicon oxide) may be formed over the major surface 100a of the substrate 100, and the alternating first and second material layers 19, 121 may be formed over the cover layer 501.

The formation of layers 501, 19 and 121 may be followed by etching the stack 120 to form at least one memory opening 81 in the stack 120, as shown in FIG. 6. An array of memory openings 81 (e.g., cylindrical memory openings or holes) may be formed in locations where vertical channels of NAND strings 150 will be subsequently formed.

The memory opening 81 may be formed by photolithography and etching as follows. First, a memory hole mask 503 (see FIG. 5) may be formed over the stack 120 and patterned to form openings 505 corresponding to the future location(s) of the memory opening(s) 81. The mask 503 may comprise any suitable mask layer, such as photoresist or a hard mask material, such as amorphous carbon (e.g., a so-called advance patterning film ("APF™")), silicon nitride, metal, etc., and may be patterned using photolithography.

Then, the stack 120 may be etched using a first etching process (e.g., using reactive ion etching (RIE)) to form at least one memory opening 81 in the stack as shown in FIG. 6. In the embodiment of FIG. 6, the etching may be stopped at the substrate 100. Following the etching to form the front side memory openings 81, the mask may be removed (such as via ashing) and the memory opening 81 may be cleaned.

Each of the front side memory openings 81 may include a sidewall 509 which is at least partially defined by the exposed surfaces of the layers 19, 121, 501 of the stack 120 and a bottom surface 511, which in this embodiment is defined by the exposed surface of the substrate 100. As shown in FIG. 6, a portion 601 of the substrate 100 exposed in the bottom surface 511 of the memory opening may be damaged by the first etching process used to form the memory opening 81.

The first etching process is typically a relatively aggressive etching process (e.g., an RIE process) in order to etch through the layers of the stack 120 and the etching may damage the surface of the semiconductor substrate 100. In addition, even after the memory opening 81 is cleaned, etching by-products may remain on the bottom surface 511 of the memory opening 81.

Referring to FIG. 7, the memory opening 81 may be etched using a second etching process that is different than the first etching process to remove the damaged portion 601 of the substrate 100 from the bottom surface 511 of the memory opening 81. The second etching process may be any suitable etching process, such as a chemical dry or wet etch, that is different from the first etching process (e.g., RIE) that is used for form the memory opening 81. The second etching process may utilize a generally less aggressive etchant than the first etching process. In one embodiment, the second etching process may comprise a dilute hydrofluoric acid (HF) wet etch or a chlorine, hydrochloric acid (HCL) and/or bromine (Br) based dry etch or a combination of the above.

Referring to FIG. 8, a single crystal semiconductor material 801 may be formed over the semiconductor substrate 100 on the bottom surface 511 of the memory opening 81 using an epitaxial growth process. In one embodiment, the substrate 100 may comprise a silicon substrate, and the material 801 may comprise single crystal silicon that is epitaxially grown from the surface of the substrate 100. The removal of the damaged portion 601 of the substrate 100 during the second etching process prior to forming the single crystal semiconductor material 801 may result in the formation of a high-quality single crystal semiconductor material 801 during the epitaxial growth process. As shown in FIG. 8, the single crystal semiconductor material 801 may be formed at least to a level that is substantially planar with the major surface 100a of the substrate 100. In embodiments, the single crystal semiconductor material 801 may be formed at least to the planar level of the cover oxide layer 501. In some embodiments, the single crystal semiconductor material 801 may be formed to a level that is above the major surface 100a of the substrate 100 (e.g., up to about 100 nm above the plane of the major surface 100a of the substrate 100).

FIG. 9 illustrates an embodiment in which the single crystal semiconductor material 801 is formed above the bottom layer 121a of sacrificial material to the first layer 19a of insulating material of the stack 120. Thus, in this embodiment, the single crystal semiconductor material 801 may form a substantially pillar-shaped protrusion 901 extending generally perpendicular to the major surface 100a of the substrate 100 within the memory opening 81. The protrusion 901 may later form a semiconductor channel portion of a lower (e.g., source-side) select gate transistor (not shown in FIG. 9 for clarity). The semiconductor channel portion of the lower select gate transistor may electrically couple a vertically-oriented semiconductor channel 1 (see FIGS. 1A, 2B and 3, above) extending within the memory opening 81 to a horizontal channel portion 903 located on or within the substrate 100 and extending substantially parallel to the major surface 100a of the substrate 100. A gate insulator 905 may be formed along the sidewall 509 of the memory opening 81 prior to forming the protrusion 901. After forming the protrusion 901, the gate insulator 905 surrounds the protrusion 901. The bottom layer 121a of sacrificial material adjacent to the protrusion 901 and gate insulator 905 may be removed through a back side opening (e.g., trench 84, such as shown in FIG. 4) and replaced with a conductive electrode material (e.g., a metal, metal alloy, heavily doped semiconductor material, etc.) to form the lower select transistor of the NAND string. Examples of suitable configurations and methods for making the lower (e.g., source side) select transistors of a monolithic three dimensional array of vertical NAND strings 150 are described, for example, in U.S. patent application Ser. No. 14/133,979, filed on Dec. 19, 2013, U.S. patent application Ser. No. 14/225,116, filed on Mar. 25, 2014, U.S. patent application Ser. No. 14/225,176, filed on Mar. 25, 2014, and U.S. Provisional Patent Application No. 61/977,173, filed on Apr. 9, 2014, all of which are incorporated by reference herein for all purposes.

Figure 10:
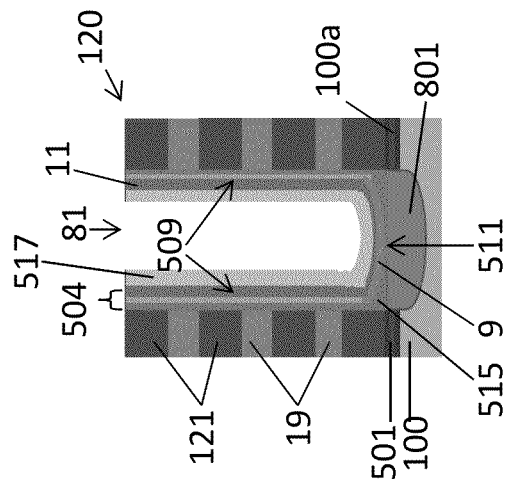

Referring to FIG. 10, at least one memory film 504 may be formed over at least a portion of the sidewall 509 of the memory opening 81 and over the single crystal semiconductor material 801 on the bottom surface 511 of the memory opening 81. As shown in FIG. 10, the at least one memory film 504 is formed over the surface of the single crystal semiconductor material 801 that is formed substantially co-planar with the major surface 100a of the substrate 100 as shown in FIG. 8, although it will be understood that the memory film 504 may also be formed over a raised protrusion 901 comprising the single crystal semiconductor material 801 as shown in FIG. 9. The memory film 504 may include, for example, a charge storage material 9 and/or a tunnel dielectric layer 11 as described above in connection with FIGS. 1A-4. The charge storage material 9 may be formed over at least a portion of the sidewall 509 and over the bottom surface 511 of the memory opening 81, and the tunnel dielectric layer 11 may be formed on the charge storage material 9 over at least a portion of the sidewall 509 and over the bottom surface 511 of the memory openings 81. In some embodiments, the memory film 504 may also include at least a portion of the blocking dielectric 7 (see FIGS. 1A-4). For example, the memory film 504 may include a layer of insulating material 515 (a cover oxide, which may be silicon oxide) formed over at least a portion of the sidewall 509 and the bottom surface 511 of the memory opening 81, and the charge storage material 9 and tunnel dielectric 11 may be formed over the layer of insulating material 515.

Referring again to FIG. 10, a layer of semiconductor material 517 may be formed over the at least one memory film 504 on the sidewall 509 and over the bottom surface 511 of the memory opening 81. The layer of semiconductor material 517 may comprise polycrystalline or amorphous semiconductor material (e.g., polysilicon or amorphous silicon).

Figure 11:
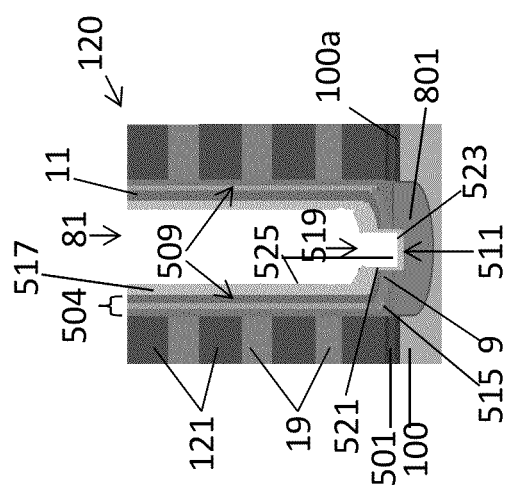

Referring to FIG. 11, the memory opening 81 may be etched using a third etching process to remove a portion of the layer of semiconductor material 517 and a portion of the at least one memory film 504 from over the bottom surface 511 of the memory opening 81 and expose the single crystal semiconductor material 801 on the bottom surface 511 of the memory opening 81. In embodiments, the third etching process may be different from the first etching process, and may utilize a less aggressive etchant than the first etching process to minimize damage to the surfaces of the semiconductor materials 517 and 801 exposed to the etch. Alternatively, the third etching process may utilize the same etching process as the first etching step (e.g., RIE).

The third etching process may form a generally cylindrically-shaped opening 519 through the layer of semiconductor material 517 and the at least one memory film 504 as shown in FIG. 11. The generally cylindrically-shaped opening 519 may include a sidewall 521 defined by the layer of semiconductor material 517 and the memory film 504 and a bottom surface 523 that is defined by the single crystal semiconductor material 801 exposed on the bottom surface 511 of the memory opening 81. The layer of semiconductor material 517 may protect the memory film 504 over the sidewall 509 of the memory opening 81 from etching damage during the third etching process.

The third etching process may produce damaged portions 525 on the surfaces of the layer of semiconductor material 517 and the single crystal semiconductor material 801 that are exposed during the etching.

Figure 12:
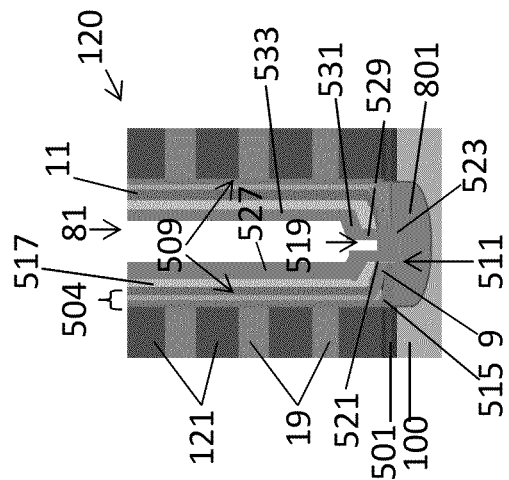

Referring to FIG. 12, a semiconductor channel material 527 may be formed over the layer of semiconductor material 517 the sidewall 509 of the memory opening 81 and over the single crystal semiconductor material 801 on the bottom surface 511 of the memory opening 81. In embodiments, the semiconductor channel material 527 may comprise a single crystal semiconductor material (e.g., single crystal silicon) and may be formed by epitaxial growth from the single crystal semiconductor material 801 exposed on the bottom surface 511 of the memory opening 81. The single crystal semiconductor channel material 527 may be formed over the portions 525 of the layer of semiconductor material 517 and the single crystal semiconductor material 801 that were damaged during the third etching process and may at least partially heal the damage.

As shown in FIG. 12, the single crystal semiconductor channel material 527 may include a first portion 529 that is formed by epitaxial growth from the single crystal material 801 exposed on the bottom surfaced 523 of the generally cylindrically-shaped opening 519 in a first direction that is substantially perpendicular to the major surface 100a of the substrate 100 (e.g., a substantially vertical direction as shown in FIG. 12). The first portion 529 may extend over the sidewall 521 of the generally cylindrically-shaped opening 519. The first portion 529 may have a hollow, generally cylindrical shape that is located within the generally cylindrically-shaped opening 519, as shown in FIG. 12.

A second portion 531 of the channel material 527 may be formed by epitaxial growth from the generally cylindrically shaped opening 519 in a second direction that is substantially parallel to the major surface 100a of the substrate 100 (e.g., a substantially horizontal direction as shown in FIG. 12). As illustrated in FIG. 12, the second portion 531 may extend over the bottom surface 511 of the memory opening 81 and may be located over portions of the layer of semiconductor material 517 and the memory film 504 that extend on the bottom surface 511 of the memory opening 81. The second portion 531 may have a hollow ring disk shape that extends radially-outwards from the first portion 529 over the bottom surface 511 of the memory opening 81, as shown in FIG. 12.

A third portion 533 of the channel material 527 may be formed by epitaxial growth from the bottom surface 511 of the memory opening 81 in the first direction that is substantially perpendicular to the major surface 100a of the substrate 100 (e.g., a substantially vertical direction in FIG. 12). The third portion 533 may extend over the layer of semiconductor material 517 and the memory film 504 along at least a portion of the sidewall 509 of the memory opening 81. The third portion 533 may have a hollow, generally cylindrical shape that has a larger diameter than the first portion 529. The third portion 533 extends from the second portion 531 over the sidewall 509 of the memory opening 81, as shown in FIG. 12.

In embodiments, the first, second and third portions 529, 531, 533 of the single crystal semiconductor channel material 527 may be formed under conditions that provide a higher growth rate of epitaxial single crystal semiconductor material than a growth rate from the layer 517 of polycrystalline or amorphous semiconductor material. Thus, the single crystal semiconductor channel material 527 may grow from the single crystal semiconductor material 801 at a significantly higher rate than the growth of polycrystalline or amorphous semiconductor material from layer 517. The single crystal semiconductor channel material 527 may grow up through the generally cylindrical opening 519 and over layer 517 along at least a portion of the sidewall 509 of the memory opening 81. In some embodiments, the single crystal channel material 527 may extend over the sidewall 509 over a substantial portion of the length of the memory opening 81 through the stack 120, including over the entire length of the memory opening 81. In other embodiments, the single crystal channel material 527 may extend at least adjacent to each of the device levels of the stack 120 (i.e., Level A, Level B, etc., as shown in FIGS. 1A, 2A and 3). An optional core insulator 2 (i.e., a dielectric material, such as silicon oxide) as shown in FIGS. 1A-B may be formed within the hollow, generally cylindrically shaped third portion 533 of the layer of channel material 527.

Figure 13:
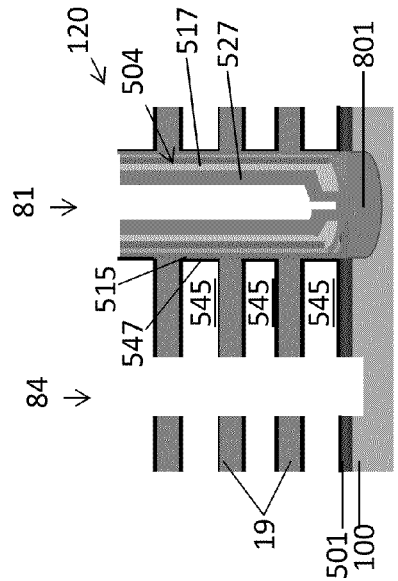
Figure 14:
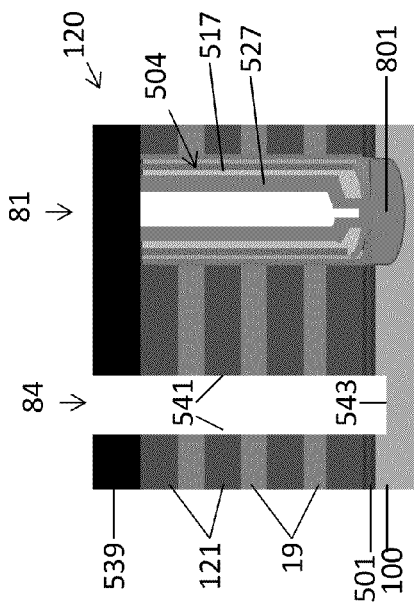
Figure 15:
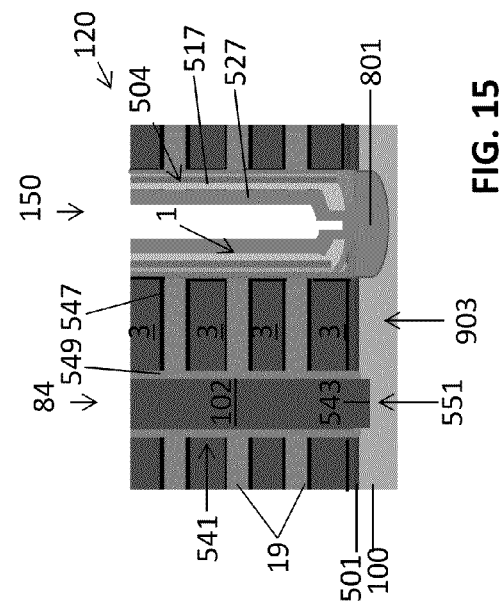

FIGS. 13-15 are side cross-sectional views illustrating additional steps in the formation of a portion of a NAND string array according to the first embodiment and taken along line B-B' in the top schematic view of FIG. 4. Referring to FIG. 13, the stack 120 may be etched (e.g., through a mask 539 patterned by photolithography) to form one or more back side openings (e.g., trenches) 84 in the stack 120. In this embodiment, the back side opening (e.g., trench) 84 extends through the entire stack 120 to the semiconductor substrate 100. The layers 19, 121 of the stack 120 may at least partially define the two opposed sidewalls 541 of the back side opening 84, and the substrate 100 may define the bottom surface 543 of the back side opening 84.

Referring to FIG. 14, at least a portion of the second material layers 121 may be removed through the back side opening 84 to form back side recesses 545 between the first material layers 19. Layers 121 may be removed by selective etching, such as a silicon nitride selective etching (e.g., a hot phosphoric acid wet etch) which removes silicon nitride layers 121 but does not remove the silicon oxide material of layers 19. The etching may stop at the memory film 504 extending over the sidewall 509 of the memory opening 81. For example, as shown in FIG. 14, the etching may expose the insulating layer 515 (cover oxide, e.g., silicon oxide) within the back side recesses 545. As discussed above, the insulating layer 515 may form at least a portion of the blocking dielectric 7 of the NAND string.

In some embodiments, all or a portion of the blocking dielectric 7 may be formed in the back side recesses 545 through the back side opening 84. A layer 547 of dielectric material may be formed over the exposed memory film 504 in each of the back side recesses 545, as shown in FIG. 14. The blocking dielectric 7 may comprise a single layer or a stack of at least two layers of different insulating materials. For example, the different insulating materials may include silicon oxide, silicon nitride, silicon oxynitride and/or a high-k material such as $Al_2O_3$, $HfO_2$, $HfSiO$, $Ta_2O_5$ or other metal oxides. In one embodiment, the blocking dielectric 7 may include a metal oxide material, such as aluminum oxide and/or hafnium oxide, and may comprise a stack comprising at least one layer of a metal oxide and at least one layer of an additional insulating material. For example, the blocking dielectric 7 may comprise a layer 547 of aluminum oxide formed in the back side recesses 545 and a layer of silicon oxide (e.g., layer 515) which may be a portion of the memory film 504 formed in the memory opening 81.

Referring to FIG. 15, control gate electrodes 3 may be formed in the back side recesses 545 through the back side opening 84. When the blocking dielectric 7 is present in the back side recesses 545, the control gate electrodes 3 may be formed over the blocking dielectric 7 (e.g., layer 547 in FIG. 15). Each of the control gate electrodes 3 may be located in a respective device level (e.g., Level A, Level B, etc. as shown in FIGS. 1A, 2A and 4) over the major surface 100a of the substrate 100. Layers 19 of the stack 120 may provide interlevel insulating layers located between the control gate electrodes 3 in the respective device levels.

Each of the control gate electrodes 3 may comprise one or more electrically conductive metal materials, including one or more metals or metal alloys, including metal nitrides and metal silicides. In one embodiment, the control gate electrodes 3 may be formed by depositing a metal nitride liner material (e.g., tungsten nitride (WN) or titanium nitride (TiN) liner, not shown in FIG. 15) in the back side recesses 545, followed by depositing a metal (e.g., tungsten) over the metal nitride liner material to fill the back side recesses 545. Any of the metal and/or metal nitride liner material of the control gates 3 located in the back side opening 84 may be removed from the back side opening 84 (e.g., via one or more etching steps). A source region 551 may be formed by implanting the substrate 100 through the back side opening.

Referring again to FIG. 15, a layer of insulating material 549 may be formed over the sidewalls 541 of the back side opening 84, and a source side electrode 102 (i.e., source line) comprising an electrically conductive material may be formed within the back side opening 84. The layer of insulating material 549 may electrically insulate the source side electrode 102 from the plurality of control gates 3 along the sidewall 541 of the back side opening 84. The source side electrode 102 may comprise one or more electrically conductive materials, such as a metal, metal nitride, metal silicide or heavily doped semiconductor material. The source side electrode 102 may be formed in contact with the source region 551 located at the bottom 543 of the back side opening 84. The source region 551 may be a region of the substrate 100 having an opposite conductivity than the horizontal channel portion 903 extending on or within the substrate 100 (e.g., within a doped well region of the substrate 100). The source side electrode 102 may electrically contact the semiconductor channel 1 from below the device levels of the NAND string 150 via the source region 551 and the horizontal channel portion 903.

Figure 24:
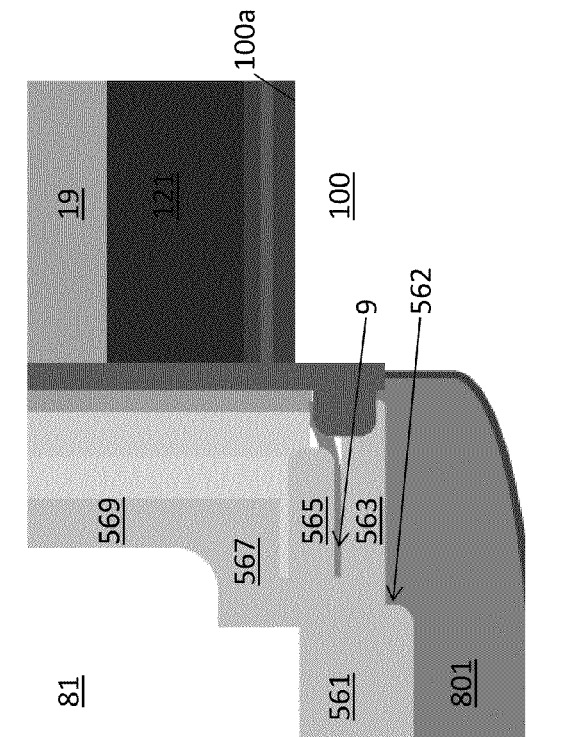
Figure 25:
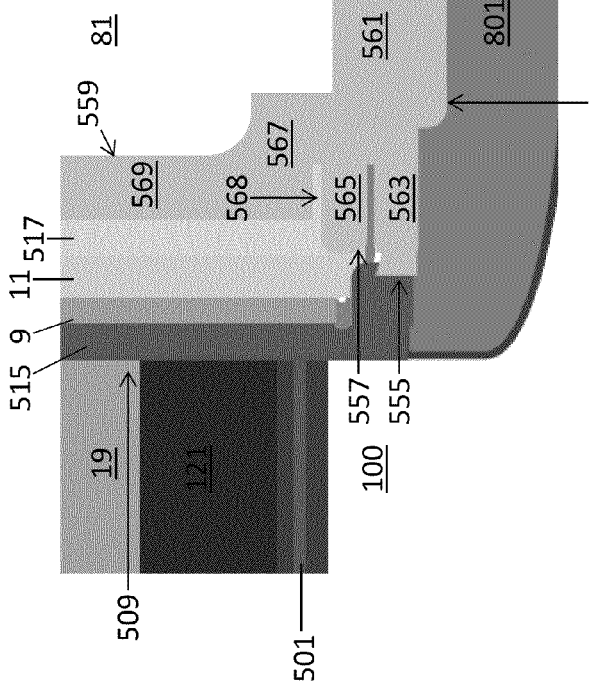

A second embodiment method of making a NAND string 150 is illustrated in FIGS. 16-25. FIGS. 16-24 are side cross-sectional views illustrating the formation of a portion of a NAND string device according to a second embodiment and taken along line A-A' in the top schematic view of FIG. 4. FIG. 25 is an enlarged view of a portion the device shown in FIG. 24.

FIGS. 16-21 correspond to FIGS. 5-8, 10 and 11 described above, and illustrate the formation of the memory opening 81 by etching the stack 120 through a mask 503 to the semiconductor substrate 100 using a first etching process (FIGS. 16 and 17) and etching through the memory opening 81 using a second etching process that is different from the first etching process to remove a damaged portion 601 of the semiconductor substrate 100 from the bottom surface 511 of the memory opening 81 (FIG. 18). The formation method also includes forming a single crystal semiconductor material 801 over the semiconductor substrate 100 on the bottom surface 511 of the memory opening 81 using an epitaxial growth process (FIG. 19), forming at least one memory film 504 on at least a portion of the sidewall 509 of the memory opening 81 and over the single crystal semiconductor material 801 on the bottom surface 511 of the memory opening 81 (FIG. 20), forming a layer of semiconductor material 517 (e.g., polycrystalline or amorphous semiconductor material) over the at least one memory film 504 on at least a portion of the sidewall 509 of the memory opening 81 and on the bottom surface 511 of the memory opening 81 (FIG. 20), and etching through the memory opening 81 using a third etching process to remove a portion of the layer of semiconductor material 517 and a portion of the at least one memory film 504 from over the bottom surface 511 of the memory opening 81 and expose the single crystal semiconductor material 801 on the bottom surface 511 of the memory opening 81 (FIG. 21).

The third etching process may form a generally cylindrically-shaped opening 519 through the layer of semiconductor material 517 and the at least one memory film 504 as shown in FIG. 21. The generally cylindrically-shaped opening 519 may include a sidewall 521 defined by the layer of semiconductor material 517 and the memory film 504 and a bottom surface 523 that is defined by the single crystal semiconductor material 801 exposed on the bottom surface 511 of the memory opening 81. The layer of semiconductor material 517 may protect the memory film 504 over the sidewall 509 of the memory opening 81 from etching damage during the third etching process. The third etching process may produce damaged portions 525 on the surfaces of the layer of semiconductor material 517 and the single crystal semiconductor material 801 that are exposed during the etching.

Referring to FIG. 22, an oxide layer 553 may be formed on the sidewall 509 and bottom surface 511 of the memory opening 81 by surface oxidation of the layer of semiconductor material 517 and the single crystal semiconductor material 801 exposed on the bottom surface 511 of the memory opening 81. In embodiments, the oxide layer 553 may be formed on the sidewall 509 and bottom surface 511 of the memory opening 81 by oxidizing the damaged portions 525 on the surfaces of the layer of semiconductor material 517 and the single crystal semiconductor material 801 that were damaged during the third etching step.

Figure 23:
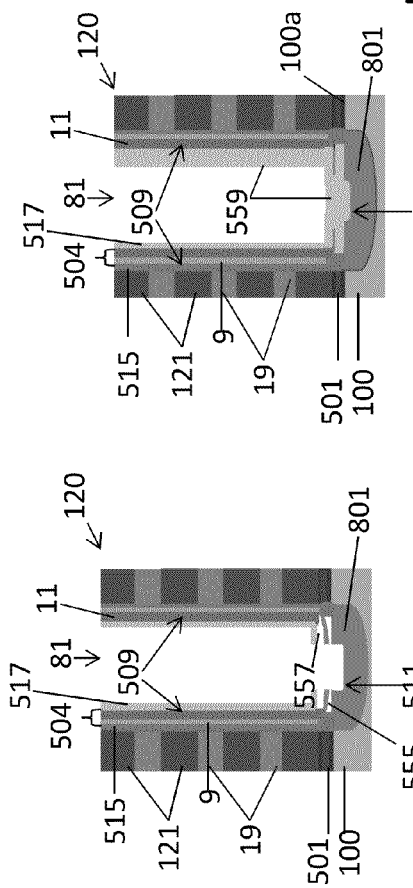

Referring to FIG. 23, the oxide layer 553 may be removed from the sidewall 509 and bottom surface 511 of the memory opening 81. In embodiments, the oxide layer 553 may be removed by a fourth etching process that is different than the first etching process. The fourth etching process may selectively etch the oxide material of layer 553 without removing the layer of semiconductor material 517 and the single crystal semiconductor material 801 on the bottom surface 511 of the memory opening 81. Thus, the portions 525 of the surfaces of the layers 517, 801 that are damaged by the third etching process may be converted to an oxide material and then selectively removed from the memory opening 81 during the fourth etching process.

In embodiments, the fourth etching process may remove at least a portion of the insulating (i.e., cover oxide) layer 515 and the tunnel oxide layer 11 of the memory film 504 from over the bottom surface 511 of the memory opening 81 to provide a first recessed portion 555 extending substantially parallel to the bottom surface 511 of the memory opening 81 between the exposed surface of the single crystal semiconductor material 801 and the layer of charge storage material 9, and a second recessed portion 557 extending substantially parallel to the bottom surface 511 of the memory opening 81 between the layer of charge storage material 9 and the layer of semiconductor material 517. The layer of charge storage material 9 may comprise silicon nitride, and may not be significantly etched during the fourth etching process, which may selectively etch the oxide materials of layers 553, 515 and 11 relative to the silicon nitride material of the charge storage material 9. In one embodiment, the fourth etching process may comprise a wet chemical etch using hydrofluoric acid.

Referring to FIG. 24, a semiconductor channel material 559 may be formed over the layer of semiconductor material 517 on the sidewall 509 of the memory opening 81 and over the single crystal semiconductor material 801 on the bottom surface 511 of the memory opening 81. In embodiments, the semiconductor channel material 559 may comprise a polycrystalline semiconductor material (e.g., polysilicon). In other embodiments, the semiconductor channel material 559 may be a single crystal silicon material (e.g., single crystal silicon), which may be epitaxially grown from the single crystal semiconductor material 801 as described above with reference to the first embodiment of FIGS. 5-15. The semiconductor channel material 559 may be formed within the generally cylindrically-shaped opening 519 (see FIGS. 21 and 22) and may fill the first and second recessed portions 555, 557 (see FIG. 23).

FIG. 25 is an enlarged view of the lower portion of FIG. 24 and shows the interface between the semiconductor channel material 559 and the single crystal semiconductor material 801 on the bottom surface 511 of the memory opening 81. As shown in FIG. 25, the semiconductor channel material 559 may include a generally cylindrically shaped first portion 561 which contacts the single crystal semiconductor material 801 at the bottom surface 511 of the memory opening 81. The first portion 561 may extend from the bottom surface 511 of the memory opening 81 in a first direction that is substantially perpendicular to the major surface 100a of the substrate 100 (i.e., a substantially vertical direction in FIG. 25). The semiconductor channel material 559 may also include a generally disk-shaped second portion 563 which comprises a projection extending from a sidewall 562 of the first portion 561 into the first recess 555 substantially parallel to the major surface 100a of the substrate 100 (i.e., in a substantially horizontal direction in FIG. 25). The semiconductor channel material 559 may also include a generally disk-shaped third portion 565 which comprises a projection extending from the sidewall 562 of the first portion 561 into the second recess 557 substantially parallel to the major surface 100a of the substrate 100. As shown in FIG. 25, the charge storage material 9 may surround the first portion 561 of the semiconductor channel material 559 between the second 563 and third 565 portions of the semiconductor channel material 559.

The semiconductor channel material 559 may also include a fourth portion 567 that extends radially-outwards from the first portion 561 above the layer of semiconductor material 517 substantially parallel to the major surface 100a of the substrate 100. As shown in FIG. 25, the fourth portion 567 may extend over a portion 568 of the layer of semiconductor material 517. The semiconductor channel material 559 may also include a hollow, generally cylindrically-shaped fifth portion 569 that extends above the fourth portion 567 over the sidewall 509 of the memory opening 81. The channel material 559 and semiconductor layer 517 may together form the vertical channel 1 of a NAND string 150, such as described above in connection with FIGS. 1A-4. An optional core insulator 2 (i.e., a dielectric material, such as silicon oxide) as shown in FIGS. 1A-B may be formed within the hollow, generally cylindrically shaped fifth portion 569 of the channel material 559.

Following the formation of the semiconductor channel material 559, the method may continue as shown in FIGS. 13-15 to form the monolithic three-dimensional NAND string memory device.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:
1. A method of fabricating a memory device, comprising:
forming a material layer stack over a major surface of a semiconductor substrate;
etching the stack through a mask to the semiconductor substrate using a first etching process to form a memory opening having a sidewall defined at least in part by the stack and a bottom surface that is defined by the semiconductor substrate;
etching through the memory opening using a second etching process that is different from the first etching process to remove a damaged portion of the semiconductor substrate from the bottom surface of the memory opening;
forming a single crystal semiconductor material over the semiconductor substrate on the bottom surface of the memory opening using an epitaxial growth process;
forming at least one memory film on at least a portion of the sidewall of the memory opening and over the single crystal semiconductor material on the bottom surface of the memory opening;
forming a layer of semiconductor material over the at least one memory film on at least a portion of the sidewall of the memory opening and on the bottom surface of the memory opening;
etching through the memory opening using a third etching process to remove a portion of the layer of semiconductor material and a portion of the at least one memory film from over the bottom surface of the memory opening and expose the single crystal semiconductor material on the bottom surface of the memory opening; and
forming a semiconductor channel material over the layer of semiconductor material on the sidewall of the memory opening and over the single crystal semiconductor material on the bottom surface of the memory opening,
wherein:
forming the layer of semiconductor material comprises forming a layer of polycrystalline or amorphous semiconductor material;
forming the semiconductor channel material comprises forming a single crystal semiconductor layer of channel material over the layer of polycrystalline or amorphous semiconductor material;
the single crystal semiconductor layer of channel material is formed by epitaxial growth from the single crystal semiconductor material exposed on the bottom surface of the memory opening;
etching through the memory opening to remove a portion of the layer of polycrystalline or amorphous semiconductor material and a portion of the at least one memory film from over the bottom surface of the memory opening comprises forming a generally cylindrically-shaped opening through the layer of polycrystalline or amorphous semiconductor material and the at least one memory film;
the generally cylindrically-shaped opening comprises a sidewall defined by the layer of polycrystalline or amorphous semiconductor material and the at least one memory film and a bottom surface that is defined by the single crystal semiconductor material exposed on the bottom surface of the memory opening;
forming the single crystal semiconductor layer of channel material comprises:

forming a first portion of the layer of channel material by epitaxial growth from the single crystal semiconductor material exposed on the bottom surface of the generally cylindrically-shaped opening in a first direction that is substantially perpendicular to the major surface of the substrate, forming a second portion of the layer of channel material by epitaxial growth from the generally cylindrically shaped opening in a second direction that is substantially parallel to the major surface of the substrate over the bottom surface of the memory opening, and forming a third portion of the layer of channel material by epitaxial growth from the bottom surface of the memory opening in the first direction that is substantially perpendicular to the major surface of the substrate over the sidewall of the memory opening; and the first, second and third portions of the layer of channel material are formed under conditions that provide a higher growth rate of epitaxial single crystal semiconductor material than a growth rate of the layer of polycrystalline or amorphous semiconductor material.

2. The method of claim 1, wherein the semiconductor substrate comprises a silicon substrate, the single crystal semiconductor material formed over the semiconductor substrate on the bottom surface of the memory opening comprises single crystal silicon, the layer of polycrystalline or amorphous semiconductor material comprises polysilicon, and the single crystal semiconductor layer of channel material comprises single crystal silicon.

3. The method of claim 2, wherein the third etching process is different from the first etching process.

4. The method of claim 3, wherein the single crystal semiconductor layer of channel material is formed over portions of the layer of polycrystalline or amorphous semiconductor material and the single crystal semiconductor material exposed on the bottom surface of the memory opening that are damaged by the third etching process to at least partially heal the damage.

5. The method of claim 1, wherein forming the material layer stack over the major surface of the substrate comprises forming an initial oxide layer on the major surface of the substrate having a height above the major surface of the substrate, and wherein forming the single crystal semiconductor material over the semiconductor substrate on the bottom surface of the memory opening comprises forming the single crystal semiconductor material to at least the planar level of the initial oxide layer.

6. The method of claim 1, wherein the first, second and third portions of the single crystal semiconductor layer of channel material comprise a hollow, generally cylindrically-shaped first portion within the generally cylindrically-shaped opening, a hollow ring disk shaped second portion that extends radially-outwards from the first portion over the bottom surface of the memory opening, and a hollow, generally cylindrically-shaped third portion that extends from the second portion over the sidewall of the memory opening.

7. The method of claim 6, further comprising forming a dielectric material within a core of the hollow, generally cylindrically shaped third portion of the layer of channel material.

8. The method of claim 1, further comprising:
forming an oxide layer on the sidewall and bottom surface of the memory opening by surface oxidation of the layer of semiconductor material and the single crystal semiconductor material exposed on the bottom surface of the memory opening; and removing the oxide layer from the sidewall and bottom surface of the memory opening.

9. The method of claim 8, wherein the semiconductor substrate comprises a silicon substrate, the single crystal semiconductor material formed over the semiconductor substrate on the bottom surface of the memory opening comprises single crystal silicon, the layer of semiconductor material comprises polysilicon, and the semiconductor channel material comprises at least one of polysilicon and epitaxial single crystal silicon.

10. The method of claim 9, wherein the oxide layer is formed on the sidewall and bottom surface of the memory opening by oxidizing surfaces of the layer of semiconductor material and the single crystal semiconductor material that are damaged by the third etching process.

11. The method of claim 10, wherein the oxide layer is removed by a fourth etching process that is different than the first etching process and selectively etches the oxide material without removing the layer of semiconductor material and the single crystal semiconductor material on the bottom surface of the memory opening.

12. The method of claim 11, wherein:
the at least one memory film comprises a cover oxide layer, a layer of charge storage material over the cover oxide layer, and a tunnel oxide layer over the layer of charge storage material; and the fourth etching process removes at least a portion of the cover oxide layer and the tunnel oxide layer from over the bottom surface of the memory opening to provide a first recess extending substantially parallel to the bottom surface of the memory opening between the exposed surface of the single crystal semiconductor material and the layer of charge storage material and a second recess extending substantially parallel to the bottom surface of the memory opening between the layer of charge storage material and the layer of semiconductor material.

13. The method of claim 12, wherein the layer of charge storage material comprises silicon nitride and wherein the fourth etching process comprises a wet chemical etch using hydrofluoric acid.

14. The method of claim 12, wherein forming the semiconductor channel material comprises filling the first and the second recessed portions.

15. The method of claim 14, wherein the semiconductor channel material comprises:
a generally cylindrically-shaped first portion which contacts the single crystal semiconductor material at the bottom surface of the memory opening and extends from the bottom surface of the memory opening in a first direction that is substantially perpendicular to the major surface of the substrate;

a generally disk-shaped second portion which comprises a projection extending from a sidewall of the first portion into the first recess substantially parallel to the major surface of the substrate;

a generally disk-shaped third portion which comprises a projection extending from a sidewall of the first portion into the second recess substantially parallel to the major surface of the substrate;

a fourth portion that extends radially-outwards from the first portion above the layer of semiconductor material substantially parallel to the major surface of the substrate; and a hollow, generally cylindrically-shaped fifth portion that extends from the above the fourth portion over the sidewall of the memory opening.

16. The method of claim 15, wherein:
the charge storage material surrounds the first portion of the semiconductor channel material between the second and the third portions of the semiconductor channel material; and
the fourth portion of the semiconductor channel material extends over a portion of the layer of semiconductor material.

17. The method of claim 1, wherein the first etching process comprises a reactive ion etching (RIE) process, and the second etching process removes the damaged portion of the semiconductor substrate that is damaged by the RIE etching.

18. The method of claim 17, wherein the second etching process comprises at least one of a dilute HF wet etch, a chlorine based dry etch, a hydrochloric acid (HCL) based dry etch and a bromine (Br) based dry etch.

19. The method of claim 1, wherein the semiconductor channel material extending substantially perpendicular to the major surface of the substrate forms an end portion of a semiconductor channel of a NAND string, wherein the stack comprises:
a plurality of control gate electrodes extending substantially parallel to the major surface of the substrate, wherein the plurality of control gate electrodes comprises at least a first control gate electrode located in a first device level and a second control gate electrode located in a second device level located over the major surface of the substrate and below the first device level; and
an first insulating material layer located between the first control gate electrode and the second control gate electrode, and the at least one memory film over the sidewall of the memory opening is located between each of the plurality of control gate electrodes and the semiconductor channel.

20. The method of claim 19, wherein forming the stack comprises:
forming an alternating plurality of first insulating material layers and second sacrificial material layers, the method further comprising:
forming a back side opening through the stack;
etching through the back side opening to remove at least a portion of the second sacrificial layers and form back side recesses between the first insulating material layers; and
forming a blocking dielectric and a plurality of control gate electrodes through the back side opening within the back side recesses.

21. A method of fabricating a memory device, comprising:
forming a material layer stack over a major surface of a semiconductor substrate;
etching the stack through a mask to the semiconductor substrate using a first etching process to form a memory opening having a sidewall defined at least in part by the stack and a bottom surface that is defined by the semiconductor substrate;
etching through the memory opening using a second etching process that is different from the first etching process to remove a damaged portion of the semiconductor substrate from the bottom surface of the memory opening;
forming a single crystal semiconductor material over the semiconductor substrate on the bottom surface of the memory opening using an epitaxial growth process;
forming at least one memory film on at least a portion of the sidewall of the memory opening and over the single crystal semiconductor material on the bottom surface of the memory opening;
forming a layer of semiconductor material over the at least one memory film on at least a portion of the sidewall of the memory opening and on the bottom surface of the memory opening;
forming an oxide layer on the sidewall and bottom surface of the memory opening by surface oxidation of the layer of semiconductor material and the single crystal semiconductor material exposed on the bottom surface of the memory opening;
removing the oxide layer from the sidewall and bottom surface of the memory opening;
etching through the memory opening using a third etching process to remove a portion of the layer of semiconductor material and a portion of the at least one memory film from over the bottom surface of the memory opening and expose the single crystal semiconductor material on the bottom surface of the memory opening; and
forming a semiconductor channel material over the layer of semiconductor material on the sidewall of the memory opening and over the single crystal semiconductor material on the bottom surface of the memory opening;
wherein:
the semiconductor substrate comprises a silicon substrate, the single crystal semiconductor material formed over the semiconductor substrate on the bottom surface of the memory opening comprises single crystal silicon, the layer of semiconductor material comprises polysilicon, and the semiconductor channel material comprises at least one of polysilicon and epitaxial single crystal silicon;
the oxide layer is formed on the sidewall and bottom surface of the memory opening by oxidizing surfaces of the layer of semiconductor material and the single crystal semiconductor material that are damaged by the third etching process;
the oxide layer is removed by a fourth etching process that is different than the first etching process and selectively etches the oxide material without removing the layer of semiconductor material and the single crystal semiconductor material on the bottom surface of the memory opening;
the at least one memory film comprises a cover oxide layer, a layer of charge storage material over the cover oxide layer, and a tunnel oxide layer over the layer of charge storage material;
the fourth etching process removes at least a portion of the cover oxide layer and the tunnel oxide layer from over the bottom surface of the memory opening to provide a first recess extending substantially parallel to the bottom surface of the memory opening between the exposed surface of the single crystal semiconductor material and the layer of charge storage material and a second recess extending substantially parallel to the bottom surface of the memory opening between the layer of charge storage material and the layer of semiconductor material;
forming the semiconductor channel material comprises filling the first and the second recessed portions; and
forming the semiconductor channel material comprises:
a generally cylindrically-shaped first portion which contacts the single crystal semiconductor material at the bottom surface of the memory opening and extends from the bottom surface of the memory opening in a first direction that is substantially perpendicular to the major surface of the substrate;
a generally disk-shaped second portion which comprises a projection extending from a sidewall of the first portion into the first recess substantially parallel to the major surface of the substrate;
a generally disk-shaped third portion which comprises a projection extending from a sidewall of the first portion into the second recess substantially parallel to the major surface of the substrate;
a fourth portion that extends radially-outwards from the first portion above the layer of semiconductor material substantially parallel to the major surface of the substrate; and
a hollow, generally cylindrically-shaped fifth portion that extends from the above the fourth portion over the sidewall of the memory opening.

22. The method of claim 21, wherein:
the charge storage material surrounds the first portion of the semiconductor channel material between the second and the third portions of the semiconductor channel material; and
the fourth portion of the semiconductor channel material extends over a portion of the layer of semiconductor material.

23. The method of claim 21, wherein:
forming a layer of semiconductor material comprises forming a layer of polycrystalline or amorphous semiconductor material;
forming the semiconductor channel material comprises forming a single crystal semiconductor layer of channel material over the layer of polycrystalline or amorphous semiconductor material; and
the single crystal semiconductor layer of channel material is formed by epitaxial growth from the single crystal semiconductor material exposed on the bottom surface of the memory opening;
etching through the memory opening to remove a portion of the layer of polycrystalline or amorphous semiconductor material and a portion of the at least one memory film from over the bottom surface of the memory opening comprises forming a generally cylindrically-shaped opening through the layer of polycrystalline or amorphous semiconductor material and the at least one memory film;
the generally cylindrically-shaped opening comprises a sidewall defined by the layer of polycrystalline or amorphous semiconductor material and the at least one memory film and a bottom surface that is defined by the single crystal semiconductor material exposed on the bottom surface of the memory opening;
forming the single crystal semiconductor layer of channel material comprises:
forming a first portion of the layer of channel material by epitaxial growth from the single crystal semiconductor material exposed on the bottom surface of the generally cylindrically-shaped opening in a first direction that is substantially perpendicular to the major surface of the substrate over the sidewall of the generally cylindrically shaped opening;
forming a second portion of the layer of channel material by epitaxial growth from the generally cylindrically shaped opening in a second direction that is substantially parallel to the major surface of the substrate over the bottom surface of the memory opening, and
forming a third portion of the layer of channel material by epitaxial growth from the bottom surface of the memory opening in the first direction that is substantially perpendicular to the major surface of the substrate over the sidewall of the memory opening.

24. The method of claim 23, wherein the first, second and third portions of the single crystal semiconductor layer of channel material comprise a hollow, generally cylindrically-shaped first portion within the generally cylindrically-shaped opening, a hollow ring disk shaped second portion that extends radially-outwards from the first portion over the bottom surface of the memory opening, and a hollow, generally cylindrically-shaped third portion that extends from the second portion over the sidewall of the memory opening.

25. The method of claim 24, further comprising forming a dielectric material within a core of the hollow, generally cylindrically shaped third portion of the layer of channel material.

* * * * *